(12) United States Patent
Bamji

(10) Patent No.: US 12,388,536 B2
(45) Date of Patent: Aug. 12, 2025

(54) OPTICAL SIGNAL RECEIVER COMPRISING A MULTI-TAP PIXEL

(71) Applicant: Microsoft Technology Licensing, LLC, Redmond, WA (US)

(72) Inventor: Cyrus Soli Bamji, Fremont, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 264 days.

(21) Appl. No.: 18/061,140

(22) Filed: Dec. 2, 2022

(65) Prior Publication Data

US 2024/0187104 A1    Jun. 6, 2024

(51) Int. Cl.
| | |
|---|---|
| H04B 10/69 | (2013.01) |
| H04B 10/61 | (2013.01) |
| H10F 39/00 | (2025.01) |
| H10F 39/15 | (2025.01) |
| H10F 39/18 | (2025.01) |
| H04B 10/40 | (2013.01) |

(52) U.S. Cl.
CPC ........... *H04B 10/615* (2013.01); *H04B 10/69* (2013.01); *H10F 39/151* (2025.01); *H10F 39/18* (2025.01); *H10F 39/8063* (2025.01); *H04B 10/40* (2013.01)

(58) Field of Classification Search
CPC .......................... H01L 27/14812; H04B 10/40
See application file for complete search history.

(56) References Cited

U.S. PATENT DOCUMENTS

| | | | | |
|---|---|---|---|---|
| 2016/0161599 A1* | 6/2016 | Seliuchenko | ....... | H01L 27/1463 250/338.4 |
| 2019/0293764 A1* | 9/2019 | Van Nieuwenhove | ...................... | H01S 5/423 |
| 2020/0027909 A1* | 1/2020 | Ebiko | ............... | H01L 27/14656 |

(Continued)

FOREIGN PATENT DOCUMENTS

EP    3416307 B1    7/2022

OTHER PUBLICATIONS

A. Spickermann, B. J. Hosticka and A. Grabmaier, "Performance considerations for photogate based active pixel sensors," 2009 Ph. D. Research in Microelectronics and Electronics, Cork, Ireland, 2009, pp. 216-219, doi: 10.1109/RME.2009.5201359. (Year: 2009).*

(Continued)

*Primary Examiner* — Nathan M Cors
(74) *Attorney, Agent, or Firm* — Alleman Hall & Tuttle LLP

(57) ABSTRACT

Examples are disclosed that relate to the use of an optical data receiver comprising a multi-tap image sensor pixel for use in optical communications. The multi-tap pixel includes a photodetector and a plurality of taps. The optical data receiver further includes a controller comprising instructions executable for controlling the multi-tap pixel to, in a first period of time, perform a first integration on the photodetector and readout charge stored on a floating diffusion capacitor of a first tap in the plurality of taps using readout circuitry of the first tap. The controller further includes instructions executable for controlling the multi-tap pixel to, in a second period of time, perform a second integration on the photodetector and readout charge stored on a floating diffusion capacitor of a second tap in the plurality of taps using readout circuitry of the second tap.

20 Claims, 8 Drawing Sheets

(56) References Cited

U.S. PATENT DOCUMENTS

2020/0068156 A1    2/2020  Ma et al.
2021/0242354 A1    8/2021  Wang et al.
2024/0118399 A1*   4/2024  Jang .................... G01S 17/894

OTHER PUBLICATIONS

International Search Report and Written Opinion received for PCT Application No. PCT/US2023/034288 mailed on May 21, 2024, 18 Pages.

* cited by examiner

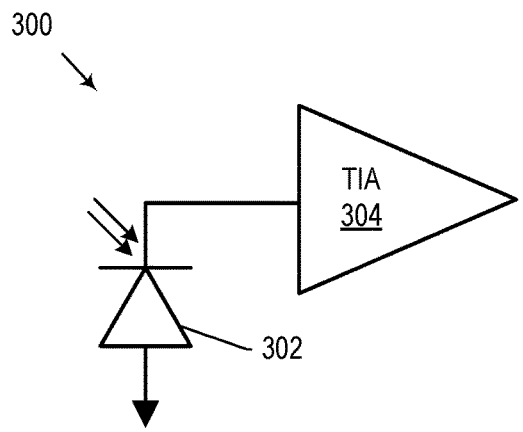
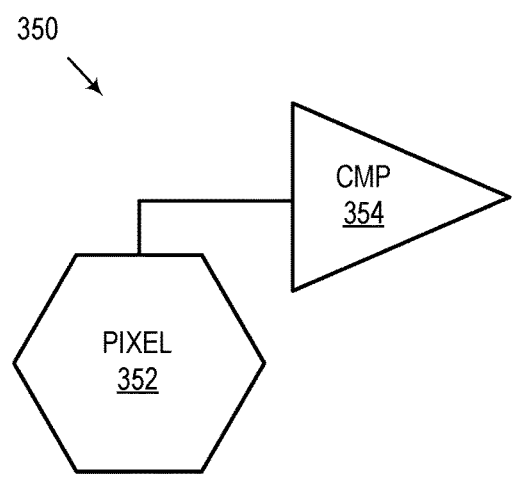
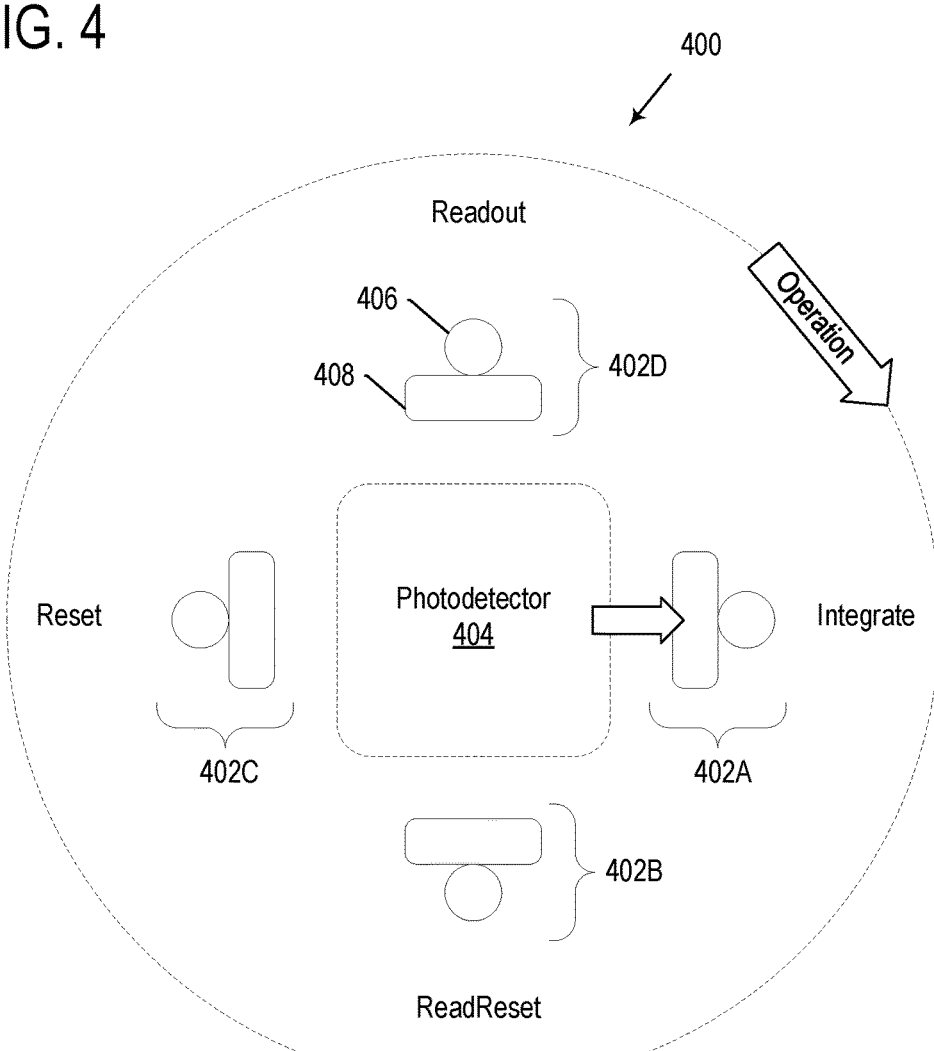

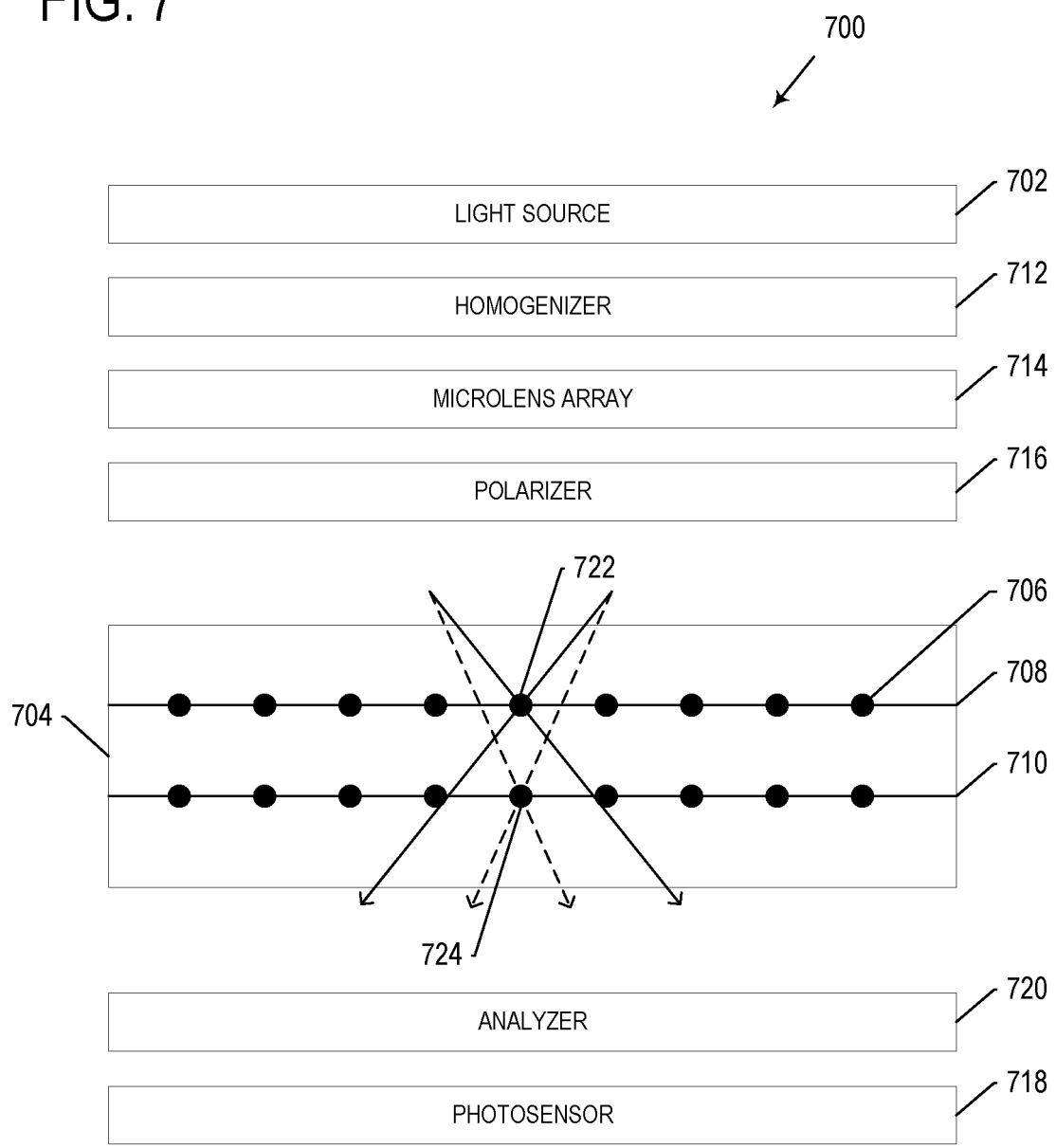

OPTICAL SIGNAL RECEIVER COMPRISING A MULTI-TAP PIXEL

BACKGROUND

A data center is a facility that houses computer systems and associated components in specialized environments for telecommunications and data storage purposes. The data center centralizes an entity's information technology (IT) operations and equipment for the purposes of storing, processing, and disseminating data and applications. For example, data centers can provide backup components and infrastructure for power supply, data communication connections, environmental controls, and security devices. There exist different scales of data centers that vary in footprint and power requirements.

SUMMARY

Examples are disclosed that relate to the use of an optical data receiver comprising a multi-tap image sensor pixel for use in optical communications. The multi-tap pixel includes a photodetector and a plurality of taps. Each tap includes a floating diffusion capacitor, a transfer gate for controlling charge flow between the photodetector and the floating diffusion capacitor, and readout circuitry. The optical data receiver further includes a controller comprising instructions executable for controlling the multi-tap pixel to, in a first period of time, perform a first integration on the photodetector and readout charge stored on the floating diffusion capacitor of a first tap in the plurality of taps using the readout circuitry of the first tap. The controller further includes instructions executable for controlling the multi-tap pixel to, in a second period of time, perform a second integration on the photodetector and readout charge stored on the floating diffusion capacitor of a second tap in the plurality of taps using the readout circuitry of the second tap.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

BRIEF DESCRIPTION OF THE DRAWINGS

FIGS. 3A and 3B show a diagram schematically illustrating an example multi-tap pixel implemented with four taps.

FIG. 4 shows a timing diagram schematically illustrating an example operation of a four-tap pixel across four different time slots.

FIG. 7 shows a diagram schematically illustrating an example optical glass storage reading system utilizing a sensor comprising multi-tap pixels.

DETAILED DESCRIPTION

Inside a data center, computing devices are connected by data links. The speed of these data links and the power required to operate such data links are increasing. Data links can be categorized into different types, including optical data links and electrical data links. Optical communication is generally faster and has longer reach than electrical wiring and is thus desirable for use within a data center. Optical communication can also be characterized by higher power across short distances. A high-speed optical link can be created with a fiber sourced by high-speed optical transmitters and terminated by high-speed optical receivers. However, such implementations can be economically inefficient for some applications. For example, because of the relatively short distances in a data center, the relative cost and power (adjusted for distance) in such transmitters and receivers are high while the cost of the short fibers are low.

In view of the observations above, the present disclosure describes examples of optical sensors comprising multi-tap pixels for use in data links and other applications for low cost, low power implementations. In some implementations, a bundle of lower speed fibers performing in parallel is utilized in lieu of a single high speed optical fiber, enabling lower cost and power operation at acceptable data rates. Operating at a lower speed and, consequently in some cases, lower power enables different thermal dynamics compared to typical high-speed data links. Lower power transmission rates generate less heat, enabling different chip designs and implementations in harsher environments. Such operating paradigms enable the use of different transmitters and receivers compared to high-speed optical links. With lower speed fibers, complementary metal-oxide-semiconductor (CMOS) image sensor (CIS) technology becomes viable in terms of speed. For example, CMOS multi-tap pixels can be utilized as optical receivers. The bundle of fibers can be sourced at one end by an array of light sources and terminated on the other end by an array of photosensors implemented in said CMOS technology. Example light sources include micro-light emitting diodes (uLEDs) and vertical-cavity surface-emitting lasers (VCSELs). Using integrated circuit technology, in some examples, the array of light sources can be made monolithically from a single substrate (e.g., VCSEL array), and the array of photosensors can be a plurality of pixels on a CMOS substrate. Such implementations can drastically reduce the cost and power requirements for data link applications compared to typical high-speed optical data links.

Figure 1:
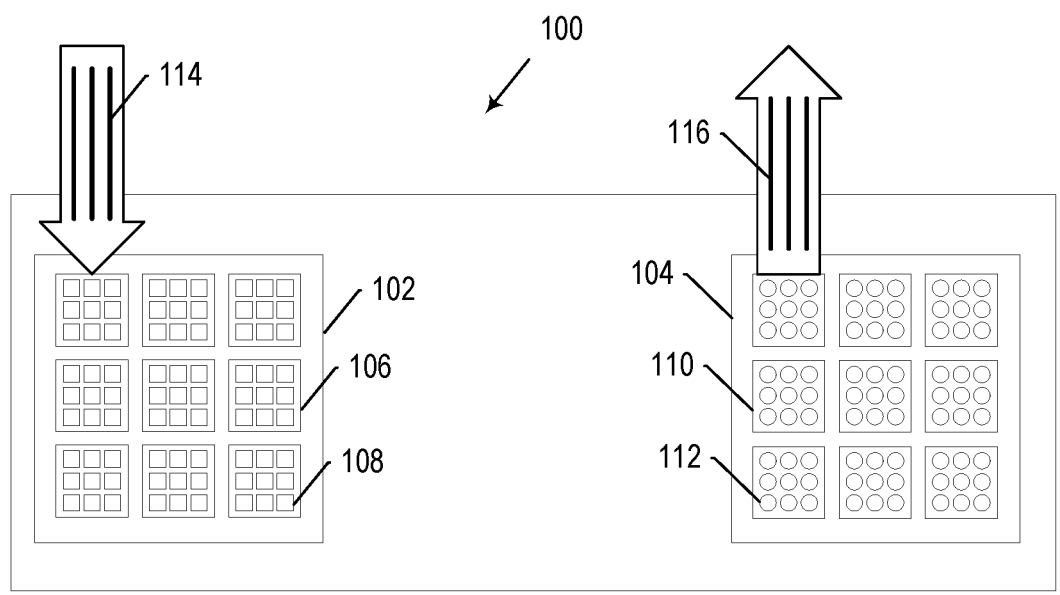
FIG. 1 shows a diagram schematically illustrating an example arrayed transceiver data link.

FIG. 1 shows a diagram schematically illustrating an example arrayed transceiver data link 100. The data link 100 includes a receiver 102 and a transmitter 104. The receiver 102 includes a plurality of receiving bundles 106, and each receiving bundle 106 includes a plurality of receiving fibers 108. Similarly, the transmitter 104 includes a plurality of transmitting bundles 110, and each transmitting bundle 110 includes a plurality of transmitting fibers 112. The receiving fibers 108 are in optical communication with photosensors (e.g., an image sensor comprising multi-tap pixels) located on the data link 100. The transmitting fibers 110 are in optical communication with light sources (e.g., VCSELs) also located on the data link 100.

The data link 100 can be designed to operate as a network switch, receiving data signals 114 using any of the receiving bundles 106 and forwarding the data signals using any of the transmitting bundles 110. For example, data signals can be transmitted 116 to a selected downstream system via a transmitting bundle 110 in communication with said selected downstream system. Higher bandwidth can be achieved in such systems by transmitting and receiving symbols encoding more than one bit of information. Different modulation schemes can be implemented to encode light signals into symbols. Example modulation schemes include phase modulation, amplitude modulation, polarization modulation, and combinations thereof.

In data links, including data links implementing a single high-speed fiber, optical signals can parasitically leak through from signal to signal due to the response speed of the receiver. In implementations utilizing multi-tap pixels, example correction methods for such issues include storing values of the previous taps and determining the error through a linear combination of the stored values.

By utilizing lower speed data links, certain technologies and their accompanying manufacturing processes and techniques become viable for implementation. Photosensors in such data links can be implemented with multi-tap pixels similar to indirect Time-of-Flight (iToF) pixels utilizing CIS technology. In some implementations, stacking technologies are utilized for forming CIS chips with increased functionality. For example, CIS chips can be formed with multiple wafer layers having various components and circuitry to enable different functions.

Figure 2:
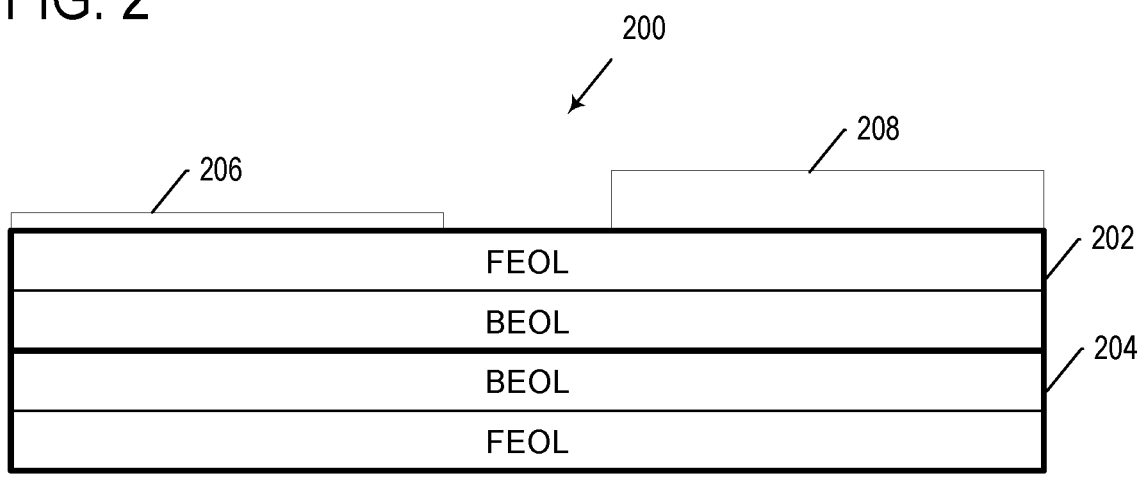
FIG. 2 shows a diagram schematically illustrating an example stacked complementary metal-oxide-semiconductor image sensor.

FIG. 2 shows a diagram schematically illustrating an example stacked CIS 200. Stacked CIS technologies can be utilized to form a chip made of multiple wafer layers, each formed using separate back end of line (BEOL) and front end of line (FEOL) fabrication processes. In FIG. 2, the example stacked CIS chip 200 includes two different wafer layers. The wafer layers include a sensor layer 202 and a circuit layer 204. Metal to metal bonding can be used to connect the two wafer layers 202, 204. The stacked CIS chip 200 further includes photosensors 206 (e.g., multi-tap pixels) and light sources 208 (e.g., VCSELs) disposed on the sensor layer 202. Stacked CIS technologies can be used for integrating more electronics and components onto the same chip, allowing for increased functionality—e.g., integrating a switching fabric to the chip to create router-like capability on the sensor chip. Additional components and circuitry can be implemented in the circuit layer 204 to provide various functionality. Chips with more than two wafer layers can also be implemented depending on the application. For example, an additional circuit layer can be added to provided further functionality. In such implementations, through silicon vias may also be used to connect wafers oriented in the same direction.

With CIS technologies, power requirements for the data links are reduced compared to higher speed optical links. For a typical high-speed optical link, the optical communication receiver operates in a current mode and feeds a transimpedance amplifier (TIA) that keeps the optical receiver's voltage constant, creating an output commensurate with a photonic signal impinging on the receiver. FIG. 3A shows a diagram schematically illustrating an optical communication receiver 300 operating in current mode. The optical communication receiver 300 includes a photodiode 302 coupled with a TIA 304. Such a setup can use a high-speed TIA and other analog circuits implemented with advanced processes generally not used for CIS pixels. The cost and power of this strategy (pixels with TIA) make sense for long distances but can be inefficient for shorter distances, such as the typical distances within a data center.

In contrast to the current mode operation of these optical communication receivers, multi-tap pixels in CMOS image sensors can operate in voltage mode where the photocurrent from the sensor accumulates in a capacitor whose voltage is read out periodically. FIG. 3B shows a diagram schematically illustrating an optical communication receiver 350 operating in voltage mode. The optical communication receiver 350 includes a multi-tap pixel 352 coupled with a comparator 354. Operating in voltage mode can save power in both the operation of the multi-tap pixel array as well as the light source array (e.g., VCSEL array). In voltage mode, the multi-tap pixels are more sensitive to optical signals compared to pixels operating in current mode with TIAs. Furthermore, operation of multi-tap pixels in voltage mode is generally more efficient than pixels operating in current mode due to a lack of the TIA. The absence of high speed TIAs also eliminates more advanced processes during manufacturing, allowing for more standard CMOS image sensor processes (CIS process) to be used.

Unlike the current mode operation with TIAs, which operates continuously, the CMOS voltage-based mode operates in discrete phases, which generally includes Reset-The-Pixel (Reset), Read-The-Reset-Value (ReadReset), Integrate, and Readout phases. Optical signal transfer occurs during integration and, as such, optical transmission data rates in CIS pixels operating in discrete phases are low relative to pixels operating in current mode with TIAs. However, pixels operating in voltage mode can compensate for the lower optical transmission data rate by implementing multiple taps. By operating multiple lower speed fibers in parallel instead of a single high-speed fiber, the slower operation of voltage domain pixels can also be further compensated. Higher data rates can be achieved through various modulation schemes, and further data rate compensation can be achieved by implementing image sensors comprising multi-tap pixels as optical receivers.

Multi-tap pixels can be implemented and operated such that the dead time in between integration phases associated with voltage domain pixels is reduced or eliminated—e.g., the multi-tap pixels can be implemented to have the optical channel available for optical signals for 100%, or near 100%, of the operating time. As such, each fiber in a receiving bundle may be associated with a photodetector operating 100% of the time in an efficient voltage-based scheme. Thus, full data rate can be achieved through each optical fiber and significant levels of power can be gained via voltage mode operation.

FIG. 4 shows a diagram schematically illustrating an example multi-tap pixel 400 implemented with four taps 402. The multi-tap pixel 400 includes a photodetector 404 shared among four taps 402. The photodetector 404 operates to accumulate a charge in response to incident photons. Each tap 402 includes a floating diffusion capacitor 406 and a transfer gate 408 for controlling charge flow between the photodetector 404 and the floating diffusion capacitor 406. Each tap 402 further includes readout circuitry for reading out the charge stored on the associated floating diffusion capacitor 406. The area for each tap 402 is relatively small compared to the photodetector 404. As such, taps can be added at a low cost compared to adding more pixels with individual photodetectors. Further, the use of multiple taps helps to use more of the incident light than the use of more pixels. With more pixels, photons impinging on pixels that are not integrating light at that time are lost. In contrast, a pixel with multiple taps integrates more total light due to the pixel integrating light for a greater fraction of total time. Other designs can also be implemented. For example, the multi-tap pixel 400 can include more or fewer than four taps.

During operation, each tap 402 operates time sequentially in the Reset-ReadReset-Integrate-Readout cycle. In some implementations, each tap 404 operates time sequentially at a different step in the cycle. For example, at a given time period, the first tap 402A may be at the Integrate step. The second tap 402B may be in the ReadReset step. The third tap 402C may be in the Reset step, and the fourth tap 402D may be in the Readout step.

During the Reset phase, the floating diffusion capacitor 406 is reset and emptied of its charge. During the ReadReset phase, the reset level of the floating diffusion capacitor 406 is read. During the Integrate phase, the photodetector 404 accumulates charge in response to incident photons, such as photo signals from optical fibers in a receiving bundle. The charge is then transferred to the floating diffusion capacitor 406 of the associated tap 402 using the transfer gate 408 of the associated tap 402. During the Readout phase, the transferred charge is read using the readout circuitry associated with the floating diffusion capacitor 406 on which the Readout is being performed.

Although each tap 402 undergoes the Reset-ReadReset-Integrate-Readout cycle, the photodetector 404 can operate to provide a photocharge signal to one of the taps 404 at any given time. For example, at any given time, one of the taps 402 operates at the Integrate step, and the photocharge signal from the photodetector 404 is steered towards said tap. Thus, the photodetector 404 can be configured to be integrating at all times, and full utilization of the fiber associated with the photodetector 404 can be achieved.

Figure 5A:
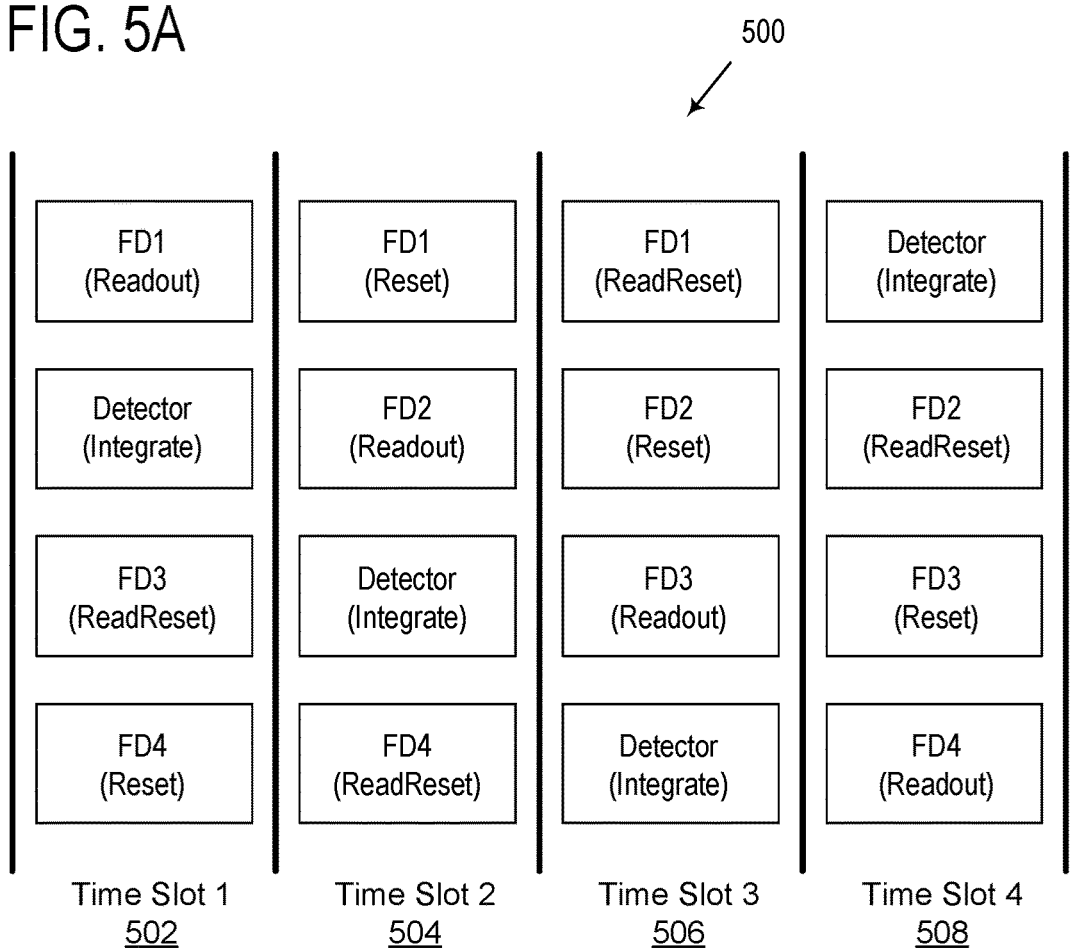
FIGS. 5A and 5B show a timing diagram schematically illustrating an example operation of a two-tap pixel across two different time slots.

FIG. 5A shows a timing diagram 500 schematically illustrating an example operation of a four-tap pixel across four different time slots 502-508. Each individual tap of the four-tap pixel operates time sequentially in a Reset-ReadReset-Integrate-Readout cycle. In the first time slot 502, a readout process is performed on a floating diffusion capacitor of a first tap (FD1) using readout circuitry associated with FD1. Also in the first time slot 502, the photodetector of the multi-tap pixel is performing a first integration. The integration can include accumulating a charge on the photodetector and steering said charge towards a floating diffusion capacitor of a particular tap using an associated transfer gate. In the illustrative example, for the first integration, the charge is steered towards a floating diffusion capacitor of a second tap (FD2) using a transfer gate of the second tap. Also in the first time slot 502, a ReadReset process is performed on a floating diffusion capacitor of a third tap (FD3), and a Reset process is performed on a floating diffusion capacitor of a fourth tap (FD4).

In the next sequential time step, each tap proceeds to the next phase. In the second time slot 504, a Reset process is performed on FD1. A Readout process is performed on FD2. A second integration is performed on the photodetector, and the charge is steered towards FD3. A ReadReset process is performed on FD4.

In the third time slot 506, a ReadReset process is performed on FD1. A Reset process is performed on FD2. A Readout process is performed on FD3. A third integration is performed on the photodetector, and the charge is steered towards FD4.

In the fourth time slot 508, a fourth integration is performed on the photodetector, and the charge is steered towards FD1. A ReadReset process is performed on FD2. A Reset process is performed on FD3. A Readout process is performed on FD4.

Although FIG. 5A illustrates a discrete step being performed for a given tap in each time slot, steps other than the Integrate step can be performed across time slots. Generally, the longest step in the operation cycle is the Integrate step. As such, the period of time for each time slot can be set to the period of time for performing the Integrate step. This enables the multi-tap pixel to operate with an optical channel available for optical signals 100%, or near 100%, of the operating time. The remaining three steps for a given tap can be performed in any time slot, including being performed in a single time slot or across multiple time slots (such as during the transition between time slots), where Integration is not being performed for said tap.

The number of recurring time slots and the period of time for each time slot can depend on various aspects. The period of time for each time slot can depend on the number of operating taps and/or the number of recurring time slots. The number of recurring time slots can depend on the number of operating taps. For example, for a four-tap pixel, the number of recurring time slots can be set to the same number of operating taps (i.e., four) since the operating cycle of a tap includes four discrete steps. In some implementations, the period of time for each time slot is set to the period of time for performing an Integrate step, which is typically the longest step in the operation cycle.

A multi-tap pixel can be implemented to include more or fewer than four taps. Implementations with multi-tap pixels having more than four taps can be implemented with a number of recurring time slots similar to the number of operating taps. In implementations with multi-tap pixels having less than four taps, the number of recurring time slots and the period of time for each time slot can depend on the speed at which the four discrete steps can be performed in the operating cycle. For example, for a two-tap pixel, at least two recurring time slots can be implemented. Depending on the length of time it takes to perform the Readout, Reset, and ReadReset, additional time slots can be implemented. In some implementations, the period of time for performing the Readout, Reset, and ReadReset steps combined is less than the period of time for performing the Integrate step. In such cases, the two-tap pixel can operate in two recurring time slots.

Figure 5B:
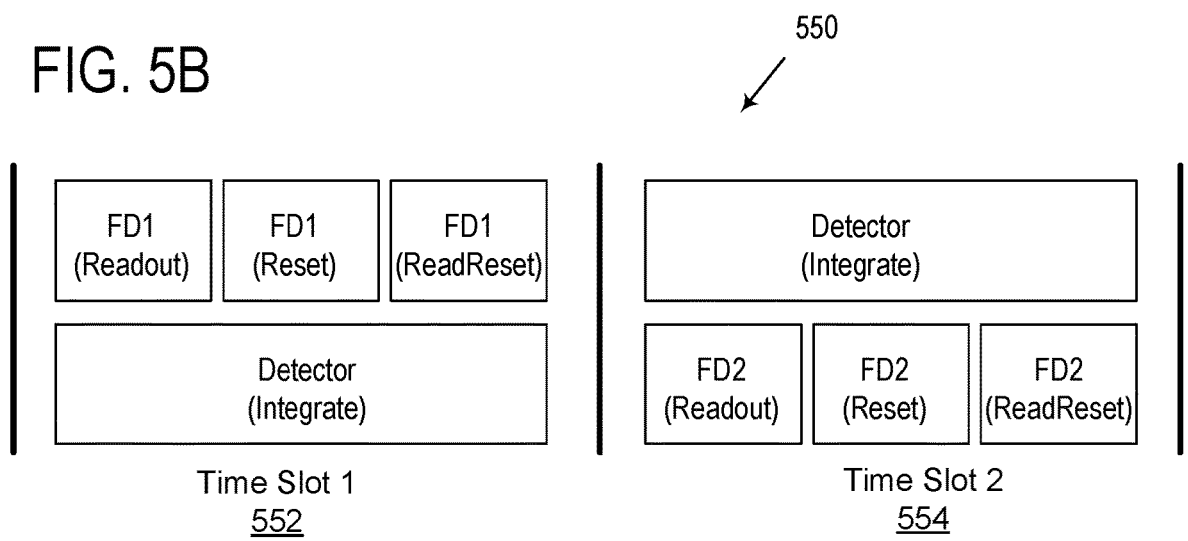

FIG. 5B shows a timing diagram 550 schematically illustrating an example operation of a two-tap pixel across two different time slots 552-554. In the first time slot 552, a floating diffusion capacitor of a first tap (FD1) is performing the Readout, Reset, and ReadReset steps. In the same time slot 552, the photodetector of the two-tap pixel is performing a first integration and steering the accumulated charge towards a floating diffusion capacitor of a second tap (FD2) using a transfer gate of the second tap. In the second time slot 554, FD2 is performing the Readout, Reset, and ReadReset steps. In the same time slot 554, the photodetector of the two-tap pixel is performing a second integration and steering the accumulated charge towards FD1 using a transfer gate of the second tap.

The multi-tap pixels and associated operation schemes illustrated in FIGS. 3-5B can be modified to implement pixels having different numbers of taps. Operation schemes are typically designed to decrease downtime by having the photodetector of the pixel operating at all times.

Figure 6A:
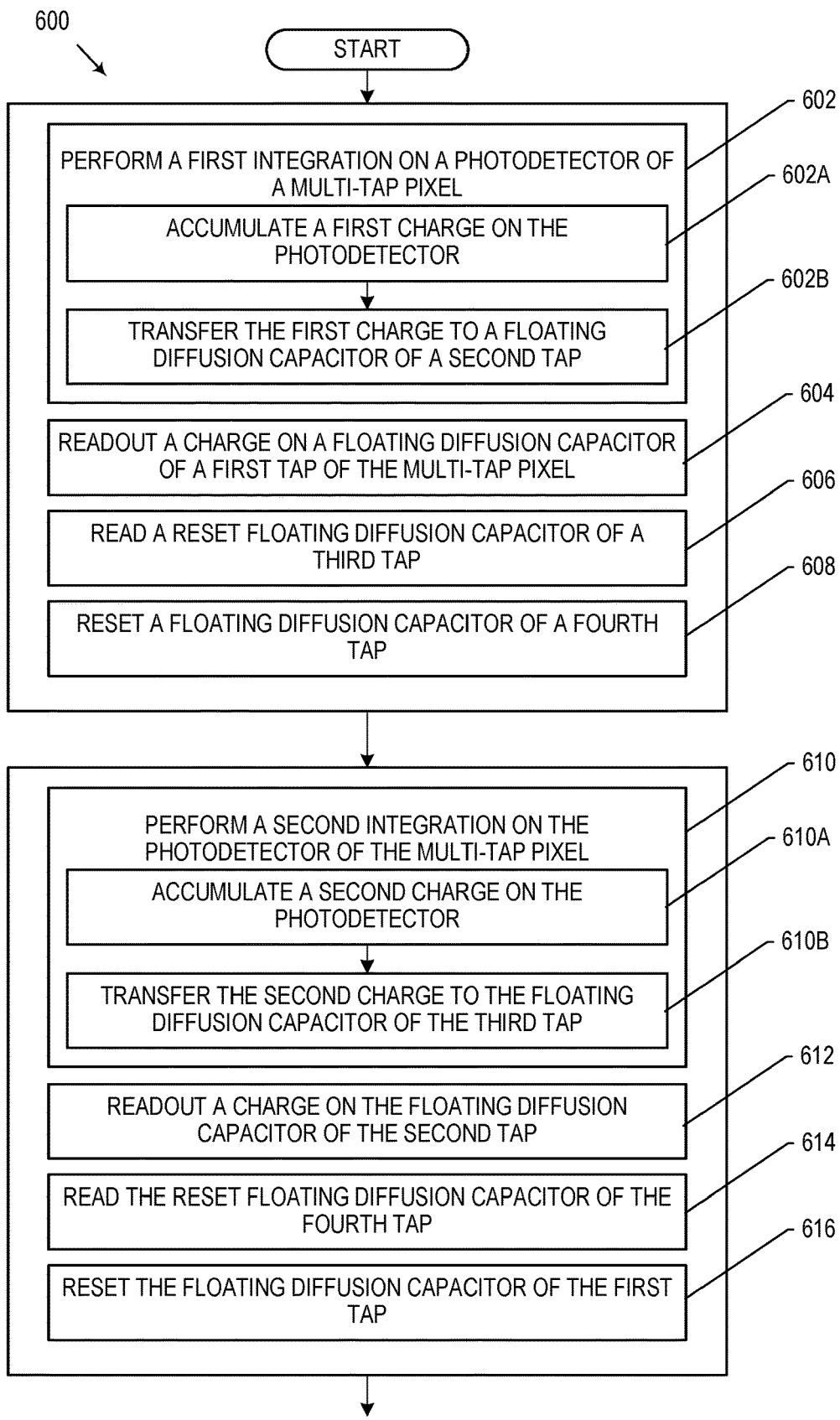
FIGS. 6A and 6B are flow diagrams illustrating an example method for operating a four-tap pixel.
Figure 6B:
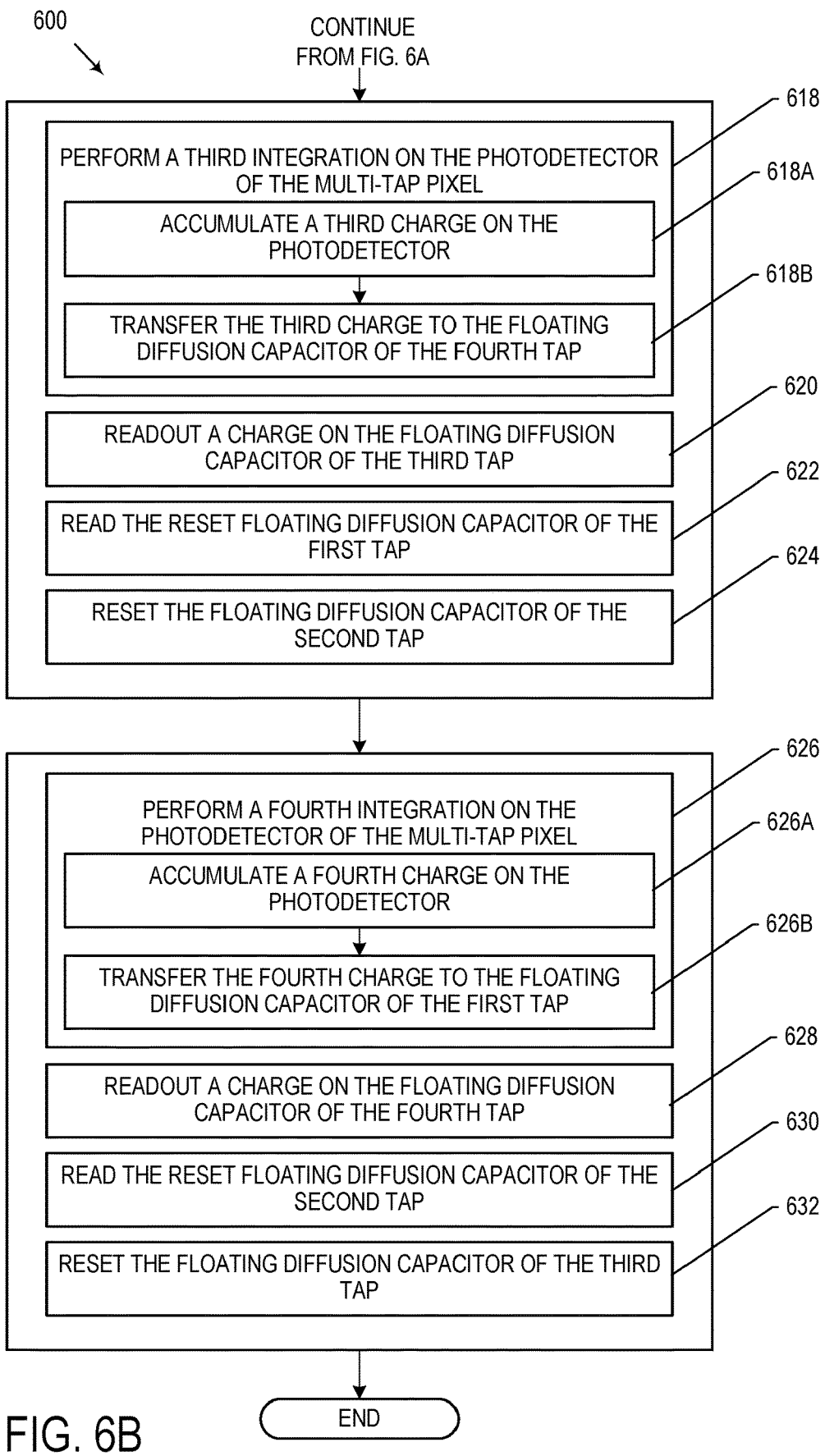

FIGS. 6A and 6B are flow diagrams illustrating an example method 600 for operating a four-tap pixel. The method 600 in FIGS. 6A and 6B describes a cycle of operations that can be repeated iteratively. At step 602, the method 600 includes, in a first period of time, performing a first integration on a photodetector of the multi-tap pixel. At step 604, the method 600 includes, in the first period of time, reading out a charge stored on a floating diffusion capacitor of a first tap of the multi-tap pixel. The charge can be readout using readout circuitry of the first tap.

During the first integration, at step 602A, a first charge is accumulated in response to incident photons representing transmitted data. At step 602B, the accumulated first charge is steered towards a floating diffusion capacitor of a second tap of the multi-tap pixel. The first charge is steered by transferring the first charge to the floating diffusion capacitor of the second tap using a transfer gate of the second tap.

At step 606, the method 600 includes, in the first period of time, reading a reset level of a floating diffusion capacitor of a third tap. At step 608, the method 600 includes, in the first period of time, resetting a floating diffusion capacitor of a fourth tap. Steps 602-608 are performed in the first period of time and, as such, can be performed concurrently or in any order.

At step 610, the method 600 includes, in a second period of time, performing a second integration on the photodetector. In a four-tap pixel, the second integration includes, at step 610A, accumulating a second charge on the photodetector and, at step 610B, steering the second charge towards the floating diffusion capacitor of the third tap using a transfer gate of the third tap.

The specific tap on which the second integration is performed can depend on the number of total taps in operation for the multi-tap pixel. For a two-tap pixel, the second integration includes accumulating a second charge on the photodetector and steering the second charge towards the first tap of the multi-tap pixel. In such cases, the method 600 can further include, in the first period of time, resetting the floating diffusion capacitor of the first tap after reading out the charge and reading the reset floating diffusion capacitor of the first tap. The method 600 can also include, in the second period of time, resetting the floating diffusion capacitor of the second tap after reading out the charge and reading the reset floating diffusion capacitor of the second tap.

Referring back to FIG. 6A, at step 612, the method 600 includes, in the second period of time, reading out a charge stored on the floating diffusion capacitor of the second tap. The charge can be readout using readout circuitry of the second tap. At step 614, the method 600 includes, in the second period of time, reading a reset level of the floating diffusion capacitor of the fourth tap. At step 616, the method 600 includes, in the second period of time, resetting the floating diffusion capacitor of the first tap. Steps 610-616 are performed in the second period of time and, as such, can be performed concurrently or in any order.

At step 618, the method 600 includes, in a third period of time, performing a third integration on the photodetector. The third integration includes, at step 618A, accumulating a third charge on the photodetector and, at step 618B, steering the third charge towards the floating diffusion capacitor of the fourth tap using a transfer gate of the fourth tap. At step 620, the method 600 includes, in the third period of time, reading out a charge stored on the floating diffusion capacitor of the third tap. The charge can be readout using readout circuitry of the third tap. At step 622, the method 600 includes, in the third period of time, reading a reset level of the floating diffusion capacitor of the first tap. At step 624, the method 600 includes, in the third period of time, resetting the floating diffusion capacitor of the second tap. Steps 618-624 are performed in the third period of time and, as such, can be performed concurrently or in any order.

At step 626, the method 600 includes, in a fourth period of time, performing a fourth integration on the photodetector. The fourth integration includes, at step 626A, accumulating a fourth charge on the photodetector and, at step 626B, steering the fourth charge towards the floating diffusion capacitor of the first tap using a transfer gate of the first tap. At step 628, the method 600 includes, in the fourth period of time, reading out a charge stored on the floating diffusion capacitor of the fourth tap. The charge can be readout using readout circuitry of the fourth tap. At step 630, the method 600 includes, in the fourth period of time, reading a reset level of the floating diffusion capacitor of the second tap. At step 632, the method 600 includes, in the fourth period of time, resetting the floating diffusion capacitor of the third tap. Steps 626-632 are performed in the fourth period of time and, as such, can be performed concurrently or in any order.

Multi-tap pixels can be implemented in various applications. In addition to data links in data centers, multi-tap pixels described herein can be implemented in any other type of computing devices. In some implementations, a multi-tap pixel is implemented in an optical glass storage reading system. Optical glass storage systems can store data in three-dimensional voxel grids. To read out the stored data, one or more voxels are illuminated, and the transmitted or reflected light (depending on the system) from the voxels can be detected and analyzed to determine the voxel's content. Various encoding schemes can be used to store and read data in the voxels. Example encoding schemes include amplitude-based encoding and birefringence-based encoding. In some implementations, the optical glass storage includes voxels at different depths that can be read using wavelength-based depth focus techniques, or other focusing techniques. For example, some optical materials have refractive indices dependent on the wavelength of the impinging light. Thus, with proper design and optical material use, an optical system can be implemented to focus light at different depths within the optical material using different wavelengths of light. As such, the reading system can include light sources capable of outputting light of different wavelengths. During a read operation, different wavelengths are sequentially switched on, focusing light on voxels at different depths without any mechanical motion. A photosensor downstream sequentially acquires and stores the data from the voxels.

Photosensors containing multi-tap pixels can be used to acquire a number of photo signals, each from a different voxel, in rapid succession. Each tap can store a photo signal from a voxel. Additional taps enable additional photo signals to be acquired. After a predetermined number of voxels are read, or after the taps of the pixels are full, the reading system can reposition to read a different area of voxels. During the repositioning process, readout of the taps can be performed, taking advantage of the readout dead time that is present in more typical operation of multi-tap pixels.

FIG. 7 shows a diagram schematically illustrating an example optical glass storage reading system 700 utilizing multi-tap pixels. The reading system 700 includes a light source 702 for illuminating an optical glass storage 704. Various types of light sources, such as laser sources, can be utilized. In the depicted example, the optical glass storage 704 includes a three-dimensional grid of voxels 706, with voxels 706 illustrated at a first depth 708 and a second depth 710. The two depths 708, 710 are illustrative, and the optical glass storage 704 can include voxels having more than two depth levels. The reading system 700 operates on a wavelength-based depth focus scheme to read voxels 706 of different depths within the optical glass storage 704. As such, the light source 702 can include one or more light sources capable of outputting light of different wavelengths. The reading system 700 further includes an optional homogenizer 712 for providing uniform illumination and a microlens array 714 for focusing light onto the voxels 706.

Different reading schemes can be implemented depending on the encoding of the optical glass storage system 704. Example encoding schemes include amplitude-based and birefringence-based encodings. The example reading system 700 depicted utilizes a birefringence-based encoding scheme. As such, the reading system 700 includes a polarizer 716 for polarizing light outputted by the light source 702. In the depicted example, a transmissive system is implemented, and a photosensor array 718 is disposed on a side of the optical glass storage 740 opposite the light source 702. In other implementations, a reflective system is implemented and the photosensor and the light source 702 are on the same side. Light transmitted through a voxel 706 is modified by the voxel 706 and is directed towards an analyzer 720, and the data is further transmitted to the photosensor array 718. In the depicted example, the analyzer 720 is implemented for reading angle and/or retardance of the received light. The photosensor array 718 includes a plurality of multi-tap pixels for reading multiple voxel locations simultaneously and for storing the transmitted data. The photosensor array 718 can be implemented in various ways. Example implementations include one-dimensional and two-dimensional photosensor arrays.

During a read operation, a plurality of voxels 706 is illuminated by the light source 702. Under a wavelength-based depth focus scheme, light of different wavelengths can be used to illuminate voxels 706 of different depths. For example, in the depicted system, light of wavelength 2 (represented by a solid line) is utilized to illuminate a first plurality of voxels 722 at the first depth 708, and light of wavelength $\lambda_2$ (represented by a dashed line) is utilized to illuminate a second plurality of voxels 724 at the second depth 710. Further depth levels can be illuminated using light of different wavelengths. The light source 702 first outputs light of wavelength A to illuminate the first plurality of voxels 722 at the first depth 708. Information from the first plurality of voxels 722 is analyzed and stored in a corresponding number of first taps among the plurality of multi-tap pixels in the photosensor array 718. The light source 702 then switches to output light of wavelength 22 to illuminate the second plurality of voxels 724 at the second depth 710. Information from the second plurality of voxels 724 is analyzed and stored in a corresponding number of second taps among the plurality of multi-tap pixels in the photosensor array 718. Further sets of voxels can be illuminated using light of different wavelengths, and information retrieved from such voxels are stored in further taps among the plurality of multi-tap pixels. After a predetermined number of sets of illuminations and integrations by the light source 702 and the photosensor array 718, respectively, a scanning system is used to reposition the reading system 700 to read voxels 706 at a different location. During the repositioning process, readouts of the taps of the plurality of multi-tap pixels can be performed.

Figure 8:
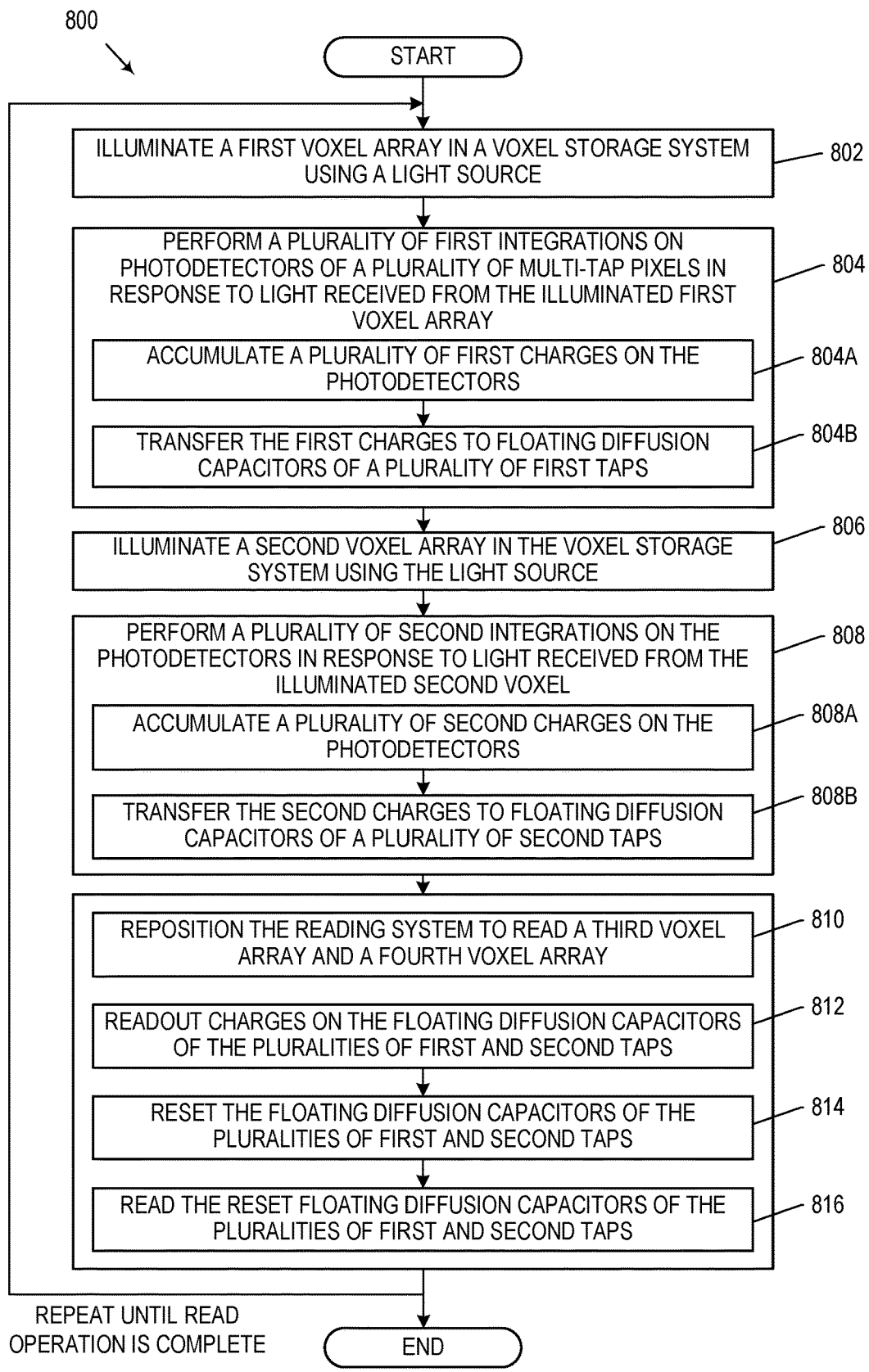
FIG. 8 shows a flow diagram illustrating an example method for reading an optical glass storage system using a sensor comprising multi-tap pixels.

FIG. 8 shows a flow diagram illustrating an example method 800 for reading an optical glass storage system using multi-tap pixels. The steps describe a process that can be iteratively looped until a predetermined number of voxel arrays are read and a read operation is completed. At step 802, the method 800 includes illuminating a first voxel array in the optical glass storage system using a light source. The first voxel array can be illuminated by light of a first wavelength outputted by the light source. One or more light sources can be implemented. In some implementations, the light source is a laser source. In further implementations, the light source is capable of rapidly switching between outputting light of different wavelengths.

At step 804, the method 800 includes performing a plurality of first integrations on a first plurality of taps of a plurality of multi-tap pixels in response to light received from the illuminated first voxel array. The first plurality of taps includes a first tap from each of the multi-tap pixels. The first integrations include, at step 804A, accumulating a plurality of first charges on photodetectors of the plurality of multi-tap pixels and, at step 804B, steering the first charges towards floating diffusion capacitors of the first plurality of taps, respectively, using transfer gates of the first plurality of taps.

At step 806, the method 800 includes illuminating a second voxel array in the optical glass system using the light source. The second voxel array can be illuminated by light of a second wavelength outputted by the light source.

At step 808, the method 800 includes performing a plurality of second integrations on a second plurality of taps of the plurality of multi-tap pixels in response to light received from the illuminated second voxel array. The second plurality of taps includes a second tap from each of the multi-tap pixels. The second integrations include, at step 808A, accumulating a plurality of second charges on the photodetectors of the plurality of multi-tap pixels and, at step 808B, steering the second charges towards floating diffusion capacitors of the second plurality of taps, respectively, using transfer gates of the second plurality of taps.

At step 810, the method 800 includes using a repositioning system to reposition the reading system such that the light source is positioned to output light directed at a third voxel array and a fourth voxel array. The repositioning system can be implemented in various ways. For example, the optical glass storage system, the light source, and/or the photosensor can be repositioned, individually or in some combination thereof, using various mechanical means.

At step 812, the method 800 includes reading out charges stored on the floating diffusion capacitors of the pluralities of first and second taps. Readouts of the charges are performed in the same time period while the reading system is being repositioned. At step 814, the method 800 includes resetting the floating diffusion capacitors of the pluralities of first and second taps. At step 816, the method 800 includes reading reset levels of the floating diffusion capacitors of the pluralities of first and second taps. Similar to step 812, steps 814 and 816 can be performed in the same time period as the repositioning process of the reading system.

The multi-tap pixels described herein can be implemented in various applications using novel operating techniques that can improve the efficiency, both in power and cost, of the system in which they are implemented. For example, the data link and optical glass storage reading systems described above provide two example applications that utilize these operating techniques to reduce or eliminate downtime of the operation of such pixels. The reduced downtime enables operation at higher bandwidth while the nature of these pixels allows for operation at lower power, enabling new implementations with efficiency figures orders of magnitude lower than typical applications.

In some embodiments, the methods and processes described herein may be tied to a computing system of one or more computing devices. In particular, such methods and processes may be implemented as a computer-application program or service, an application-programming interface (API), a library, and/or other computer-program product.

Figure 9:
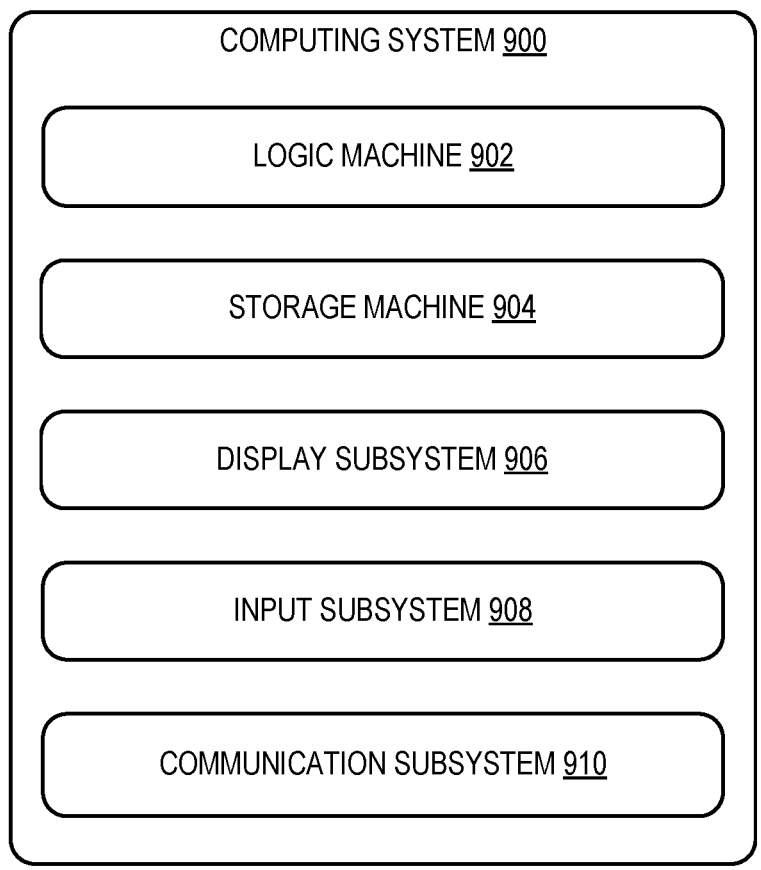
FIG. 9 schematically shows a block diagram of an example computing system.

FIG. 9 schematically shows a non-limiting embodiment of a computing system 900 that can enact one or more of the methods and processes described above. For example, computing system 900 can be implemented as a controller that includes instructions executable for controlling a multi-tap pixel to perform any of the methods and processes described in the sections above. Computing system 900 is shown in simplified form. Computing system 900 may take the form of one or more personal computers, server computers, tablet computers, home-entertainment computers, network computing devices, gaming devices, mobile computing devices, mobile communication devices (e.g., smart phone), and/or other computing devices.

Computing system 900 includes a logic machine 902 and a storage machine 904. Computing system 900 may optionally include a display subsystem 906, input subsystem 908, communication subsystem 910, and/or other components not shown in FIG. 9.

Logic machine 902 includes one or more physical devices configured to execute instructions. For example, the logic machine 902 may be configured to execute instructions that are part of one or more applications, services, programs, routines, libraries, objects, components, data structures, or other logical constructs. Such instructions may be implemented to perform a task, implement a data type, transform the state of one or more components, achieve a technical effect, or otherwise arrive at a desired result.

The logic machine 902 may include one or more processors configured to execute software instructions. Additionally or alternatively, the logic machine 902 may include one or more hardware or firmware logic machines configured to execute hardware or firmware instructions. Processors of the logic machine 902 may be single-core or multi-core, and the instructions executed thereon may be configured for sequential, parallel, and/or distributed processing. Individual components of the logic machine 902 optionally may be distributed among two or more separate devices, which may be remotely located and/or configured for coordinated processing. Aspects of the logic machine 902 may be virtualized and executed by remotely accessible, networked computing devices configured in a cloud-computing configuration.

Storage machine 904 includes one or more physical devices configured to hold instructions executable by the logic machine 902 to implement the methods and processes described herein. When such methods and processes are implemented, the state of storage machine 904 may be transformed—e.g., to hold different data.

Storage machine 904 may include removable and/or built-in devices. Storage machine 904 may include optical memory (e.g., CD, DVD, HD-DVD, Blu-Ray Disc, etc.), semiconductor memory (e.g., RAM, EPROM, EEPROM, etc.), and/or magnetic memory (e.g., hard-disk drive, floppy-disk drive, tape drive, MRAM, etc.), among others. Storage machine 904 may include volatile, nonvolatile, dynamic, static, read/write, read-only, random-access, sequential-access, location-addressable, file-addressable, and/or content-addressable devices.

It will be appreciated that storage machine 904 includes one or more physical devices. However, aspects of the instructions described herein alternatively may be propagated by a communication medium (e.g., an electromagnetic signal, an optical signal, etc.) that is not held by a physical device for a finite duration.

Aspects of logic machine 902 and storage machine 904 may be integrated together into one or more hardware-logic components. Such hardware-logic components may include field-programmable gate arrays (FPGAs), program- and application-specific integrated circuits (PASIC/ASICs), program- and application-specific standard products (PSSP/ASSPs), system-on-a-chip (SOC), and complex programmable logic devices (CPLDs), for example.

The terms "module," "program," and "engine" may be used to describe an aspect of computing system 900 implemented to perform a particular function. In some cases, a module, program, or engine may be instantiated via logic machine 902 executing instructions held by storage machine 904. It will be understood that different modules, programs, and/or engines may be instantiated from the same application, service, code block, object, library, routine, API, function, etc. Likewise, the same module, program, and/or engine may be instantiated by different applications, services, code blocks, objects, routines, APIs, functions, etc. The terms "module," "program," and "engine" may encompass individual or groups of executable files, data files, libraries, drivers, scripts, database records, etc.

It will be appreciated that a "service", as used herein, is an application program executable across multiple user sessions. A service may be available to one or more system components, programs, and/or other services. In some implementations, a service may run on one or more server-computing devices.

When included, display subsystem 906 may be used to present a visual representation of data held by storage machine 904. This visual representation may take the form of a graphical user interface (GUI). As the herein described methods and processes change the data held by the storage machine, and thus transform the state of the storage machine 904, the state of display subsystem 906 may likewise be transformed to visually represent changes in the underlying data. Display subsystem 906 may include one or more display devices utilizing virtually any type of technology. Such display devices may be combined with logic machine 902 and/or storage machine 904 in a shared enclosure, or such display devices may be peripheral display devices.

When included, input subsystem 908 may comprise or interface with one or more user-input devices such as a keyboard, mouse, touch screen, or game controller. In some embodiments, the input subsystem 908 may comprise or interface with selected natural user input (NUI) componentry. Such componentry may be integrated or peripheral, and the transduction and/or processing of input actions may be handled on- or off-board. Example NUI componentry may include a microphone for speech and/or voice recognition; an infrared, color, stereoscopic, and/or depth camera for machine vision and/or gesture recognition; a head tracker, eye tracker, accelerometer, and/or gyroscope for motion detection and/or intent recognition; as well as electric-field sensing componentry for assessing brain activity.

When included, communication subsystem 910 may be configured to communicatively couple computing system 900 with one or more other computing devices. Communication subsystem 910 may include wired and/or wireless communication devices compatible with one or more different communication protocols. As non-limiting examples, the communication subsystem 910 may be configured for communication via a wireless telephone network, or a wired or wireless local- or wide-area network. In some embodiments, the communication subsystem 910 may allow computing system 900 to send and/or receive messages to and/or from other devices via a network such as the Internet.

Another aspect provides an optical data receiver comprising a pixel that comprises a photodetector and a plurality of taps. Each tap comprises a floating diffusion capacitor, a transfer gate for controlling charge flow between the photodetector and the floating diffusion capacitor, and readout circuitry. The optical data receiver further comprises a controller comprising instructions executable for controlling the pixel to, in a first period of time, perform a first integration on the photodetector and readout charge stored on the floating diffusion capacitor of a first tap in the plurality of taps using the readout circuitry of the first tap. The controller further comprises instructions executable for controlling the pixel to, in a second period of time, perform a second integration on the photodetector and readout charge stored on the floating diffusion capacitor of a second tap in the plurality of taps using the readout circuitry of the second tap. In this aspect, additionally or alternatively, performing the first integration comprises accumulating charge on the photodetector and transferring the accumulated charge to the floating diffusion capacitor of the second tap. In this aspect, additionally or alternatively, the controller further comprises instructions executable for controlling the pixel to, in the first period of time, reset the floating diffusion capacitor of the first tap after reading out the charge and read the reset floating diffusion capacitor of the first tap and to, in the second period of time, reset the floating diffusion capacitor of the second tap after reading out the charge and read the reset floating diffusion capacitor of the second tap. In this aspect, additionally or alternatively, the controller further comprises instructions executable for controlling the pixel to, in a third period of time, perform a third integration on the photodetector and readout charge stored on the floating diffusion capacitor of a third tap in the plurality of taps using the readout circuitry of the third tap and to, in a fourth period of time, perform a fourth integration on the photodetector and readout charge stored on the floating diffusion capacitor of a fourth tap in the plurality of taps using the readout circuitry of the fourth tap. In this aspect, additionally or alternatively, performing the first integration comprises accumulating a first charge on the photodetector and transferring the accumulated first charge to the floating diffusion capacitor of the second tap. Performing the second integration comprises accumulating a second charge on the photodetector and transferring the accumulated second charge to the floating diffusion capacitor of the third tap. Performing the third integration comprises accumulating a third charge on the photodetector and transferring the accumulated third charge to the floating diffusion capacitor of the fourth tap. Performing the fourth integration comprises accumulating a fourth charge on the photodetector and transferring the accumulated fourth charge to the floating diffusion capacitor of the first tap. In this aspect, additionally or alternatively, the controller further comprises instructions executable for controlling the pixel to, in the first period of time, reset the floating diffusion capacitor of the fourth tap and read the reset floating diffusion capacitor of the third tap. The controller further comprises instructions executable for controlling the pixel to, in the second period of time, reset the floating diffusion capacitor of the first tap and read the reset floating diffusion capacitor of the fourth tap. The controller further comprises instructions executable for controlling the pixel to, in the third period of time, reset the floating diffusion capacitor of the second tap and read the reset floating diffusion capacitor of the first tap. The controller further comprises instructions executable for controlling the pixel to, in the fourth period of time, reset the floating diffusion capacitor of the third tap and read the reset floating diffusion capacitor of the second tap. In this aspect, additionally or alternatively, the optical data receiver further comprises a stacked structure having a sensor layer and a circuit layer. In this aspect, additionally or alternatively, the optical data receiver further comprises a complementary metal-oxide-semiconductor image sensor.

Another aspect provides a network data transceiver comprising a plurality of pixels, each pixel comprising a photodetector and a plurality of taps. Each tap comprises a floating diffusion capacitor, a transfer gate for controlling charge flow between the photodetector and the floating diffusion capacitor, and readout circuitry. The network data transceiver further includes a controller comprising instructions executable for controlling a pixel in the plurality of pixels to, in a first period of time, perform a first integration on the photodetector and readout charge stored on the floating diffusion capacitor of a first tap in the plurality of taps using the readout circuitry of the first tap and to, in a second period of time, perform a second integration on the photodetector and readout charge stored on the floating diffusion capacitor of a second tap in the plurality of taps using the readout circuitry of the second tap. In this aspect, additionally or alternatively, the network data transceiver further comprises a vertical-cavity surface-emitting laser array. In this aspect, additionally or alternatively, performing the first integration comprises accumulating charge on the photodetector and transferring the accumulated charge to the floating diffusion capacitor of the second tap. In this aspect, additionally or alternatively, the controller further comprises instructions executable for controlling the pixel in the plurality of pixels to, in the first period of time, reset the floating diffusion capacitor of the first tap after reading out the charge and read the reset floating diffusion capacitor of the first tap and to, in the second period of time, reset the floating diffusion capacitor of the second tap after reading out the charge and read the reset floating diffusion capacitor of the second tap. In this aspect, additionally or alternatively, the controller further comprises instructions executable for controlling the pixel in the plurality of pixels to, in a third period of time, perform a third integration on the photodetector and readout charge stored on the floating diffusion capacitor of a third tap in the plurality of taps using the readout circuitry of the third tap and to, in a fourth period of time, perform a fourth integration on the photodetector and readout charge stored on the floating diffusion capacitor of a fourth tap in the plurality of taps using the readout circuitry of the fourth tap. In this aspect, additionally or alternatively, performing the first integration comprises accumulating a first charge on the photodetector and transferring the accumulated first charge to the floating diffusion capacitor of the second tap. Performing the second integration comprises accumulating a second charge on the photodetector and transferring the accumulated second charge to the floating diffusion capacitor of the third tap. Performing the third integration comprises accumulating a third charge on the photodetector and transferring the accumulated third charge to the floating diffusion capacitor of the fourth tap. Performing the fourth integration comprises accumulating a fourth charge on the photodetector and transferring the accumulated fourth charge to the floating diffusion capacitor of the first tap. In this aspect, additionally or alternatively, the controller further comprises instructions executable for controlling the pixel in the plurality of pixels to reset the floating diffusion capacitor of the fourth tap in the first period of time, reset the floating diffusion capacitor of the first tap in the second period of time, reset the floating diffusion capacitor of the second tap in the third period of time, and reset the floating diffusion capacitor of the third tap in the fourth period of time. In this aspect, additionally or alternatively, the plurality of pixels comprises a stacked structure having a sensor layer and a circuit layer.

Another aspect provides an optical glass storage reading system comprising a repositioning system for repositioning the optical glass storage reading system and a read head comprising a light source for illuminating the optical glass storage system, a microlens array for focusing light from the light source onto a voxel array of the optical glass storage system, and a photosensor array. The photosensor array comprises a plurality of pixels for receiving light from the optical glass storage system, each pixel comprising a photodetector and a plurality of taps. Each tap comprises a floating diffusion capacitor, a transfer gate for controlling charge flow between the photodetector and the floating diffusion capacitor, and readout circuitry. The photosensor array further comprises a controller comprising instructions executable for controlling each pixel to, in a first period of time, accumulate a first charge on the photodetector and transfer the accumulated first charge to the floating diffusion capacitor of a first tap in the plurality of taps and to, in a second period of time, accumulate a second charge on the photodetector and transfer the accumulated second charge to the floating diffusion capacitor of a second tap in the plurality of taps. The controller further comprises instructions executable for controlling each pixel to, in a third period of time, readout the first and second charges stored on the floating diffusion capacitors of the first and second taps, reset the floating diffusion capacitors of the first and second taps, and read the reset floating diffusion capacitors of the first and second taps. In this aspect, additionally or alternatively, the third period of time occurs during an activation of the repositioning system. In this aspect, additionally or alternatively, the read head further comprises a polarizer for filtering the light from the light source and an analyzer for analyzing retardance of the light from the optical glass storage system. In this aspect, additionally or alternatively, the controller further comprises instructions executable for controlling each pixel to, in a fourth period of time occurring before the third period of time, accumulate a third charge on the photodetector and transfer the accumulated third charge to the floating diffusion capacitor of a third tap in the plurality of taps and to, in a fifth period of time occurring before the third period of time, accumulate a fourth charge on the photodetector and transfer the accumulated fourth charge to the floating diffusion capacitor of a fourth tap in the plurality of taps. The controller further comprises instructions executable for controlling each pixel to, in the third period of time, readout the charges stored on the floating diffusion capacitors of the third and fourth taps.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. An optical data receiver, comprising:
a pixel comprising:
  a photodetector; and
  a plurality of taps, each tap comprising:
    a floating diffusion capacitor;
    a transfer gate for controlling charge flow between the photodetector and the floating diffusion capacitor; and
    readout circuitry; and
a controller comprising instructions executable for controlling the pixel to:
  in a first period of time:
    perform a first integration on the photodetector; and
    readout charge stored on the floating diffusion capacitor of a first tap in the plurality of taps using the readout circuitry of the first tap, wherein performing the first integration comprises:
      accumulating charge on the photodetector; and
      transferring the accumulated charge to the floating diffusion capacitor of a second tap in the plurality of taps using the readout circuitry of the second tap; and
  in a second period of time;
    perform a second integration on the photodetector; and
    readout charge stored on the floating diffusion capacitor of the second tap in the plurality of taps using the readout circuitry of the second tap.

2. The optical data receiver of claim 1, wherein performing the second integration comprises:
accumulating charge on the photodetector; and
transferring the accumulated charge to the floating diffusion capacitor of the first tap.

3. The optical data receiver of claim 2, wherein the controller further comprises instructions executable for controlling the pixel to:
in the first period of time:
  reset the floating diffusion capacitor of the first tap after reading out the charge; and
  read the reset floating diffusion capacitor of the first tap; and
in the second period of time;
  reset the floating diffusion capacitor of the second tap after reading out the charge; and
  read the reset floating diffusion capacitor of the second tap.

4. The optical data receiver of claim 1, wherein the controller further comprises instructions executable for controlling the pixel to:
in a third period of time:
  perform a third integration on the photodetector; and
  readout charge stored on the floating diffusion capacitor of a third tap in the plurality of taps using the readout circuitry of the third tap; and
in a fourth period of time:
  perform a fourth integration on the photodetector; and
  readout charge stored on the floating diffusion capacitor of a fourth tap in the plurality of taps using the readout circuitry of the fourth tap.

5. The optical data receiver of claim 4, wherein:
performing the second integration comprises:
  accumulating a second charge on the photodetector; and
  transferring the accumulated second charge to the floating diffusion capacitor of the third tap;

performing the third integration comprises:
  accumulating a third charge on the photodetector; and
  transferring the accumulated third charge to the floating diffusion capacitor of the fourth tap; and
performing the fourth integration comprises:
  accumulating a fourth charge on the photodetector; and
  transferring the accumulated fourth charge to the floating diffusion capacitor of the first tap.

6. The optical data receiver of claim 5, wherein the controller further comprises instructions executable for controlling the pixel to:
  in the first period of time:
    reset the floating diffusion capacitor of the fourth tap; and
    read the reset floating diffusion capacitor of the third tap;
  in the second period of time:
    reset the floating diffusion capacitor of the first tap; and
    read the reset floating diffusion capacitor of the fourth tap;
  in the third period of time:
    reset the floating diffusion capacitor of the second tap; and
    read the reset floating diffusion capacitor of the first tap; and
  in the fourth period of time:
    reset the floating diffusion capacitor of the third tap; and
    read the reset floating diffusion capacitor of the second tap.

7. The optical data receiver of claim 1, further comprising a stacked structure having a sensor layer and a circuit layer.

8. The optical data receiver of claim 1, further comprising a complementary metal-oxide-semiconductor image sensor.

9. A network data transceiver comprising:
  a plurality of pixels, each pixel comprising:
    a photodetector; and
    a plurality of taps, each tap comprising:
      a floating diffusion capacitor;
      a transfer gate for controlling charge flow between the photodetector and the floating diffusion capacitor; and
      readout circuitry; and
  a controller comprising instructions executable for controlling a pixel in the plurality of pixels to:
    in a first period of time:
      perform a first integration on the photodetector; and
      readout charge stored on the floating diffusion capacitor of a first tap in the plurality of taps using the readout circuitry of the first tap, wherein performing the first integration comprises:
        accumulating charge on the photodetector; and
        transferring the accumulated charge to the floating diffusion capacitor of a second tap in the plurality of taps using the readout circuitry of the second tap; and
    in a second period of time;
      perform a second integration on the photodetector; and
      readout charge stored on the floating diffusion capacitor of the second tap in the plurality of taps using the readout circuitry of the second tap.

10. The network data transceiver of claim 9, further comprising a vertical-cavity surface-emitting laser array.

11. The network data transceiver of claim 9, wherein performing the second integration comprises:
  accumulating charge on the photodetector; and
  transferring the accumulated charge to the floating diffusion capacitor of the first tap.

12. The network data transceiver of claim 9, wherein the controller further comprises instructions executable for controlling the pixel in the plurality of pixels to:
  in the first period of time:
    reset the floating diffusion capacitor of the first tap after reading out the charge; and
    read the reset floating diffusion capacitor of the first tap; and
  in the second period of time;
    reset the floating diffusion capacitor of the second tap after reading out the charge; and
    read the reset floating diffusion capacitor of the second tap.

13. The network data transceiver of claim 9, wherein the controller further comprises instructions executable for controlling the pixel in the plurality of pixels to:
  in a third period of time:
    perform a third integration on the photodetector; and
    readout charge stored on the floating diffusion capacitor of a third tap in the plurality of taps using the readout circuitry of the third tap; and
  in a fourth period of time:
    perform a fourth integration on the photodetector; and
    readout charge stored on the floating diffusion capacitor of a fourth tap in the plurality of taps using the readout circuitry of the fourth tap.

14. The network data transceiver of claim 13, wherein:
  performing the second integration comprises:
    accumulating a second charge on the photodetector; and
    transferring the accumulated second charge to the floating diffusion capacitor of the third tap;
  performing the third integration comprises:
    accumulating a third charge on the photodetector; and
    transferring the accumulated third charge to the floating diffusion capacitor of the fourth tap; and
  performing the fourth integration comprises:
    accumulating a fourth charge on the photodetector; and
    transferring the accumulated fourth charge to the floating diffusion capacitor of the first tap.

15. The network data transceiver of claim 14, wherein the controller further comprises instructions executable for controlling the pixel in the plurality of pixels to:
  in the first period of time, reset the floating diffusion capacitor of the fourth tap;
  in the second period of time, reset the floating diffusion capacitor of the first tap;
  in the third period of time, reset the floating diffusion capacitor of the second tap; and
  in the fourth period of time, reset the floating diffusion capacitor of the third tap.

16. The network data transceiver of claim 9, wherein the plurality of pixels comprises a stacked structure having a sensor layer and a circuit layer.

17. An optical glass storage reading system comprising:
  a repositioning system for repositioning the optical glass storage reading system; and
  a read head comprising;
    a light source for illuminating the optical glass storage system;

a microlens array for focusing light from the light source onto a voxel array of the optical glass storage system;
a photosensor array comprising:
a plurality of pixels for receiving light from the optical glass storage system, each pixel comprising:
a photodetector; and
a plurality of taps, each tap comprising:
a floating diffusion capacitor;
a transfer gate for controlling charge flow between the photodetector and the floating diffusion capacitor; and
readout circuitry; and
a controller comprising instructions executable for controlling each pixel to:
in a first period of time:
accumulate a first charge on the photodetector; and
transfer the accumulated first charge to the floating diffusion capacitor of a first tap in the plurality of taps;
in a second period of time;
accumulate a second charge on the photodetector; and
transfer the accumulated second charge to the floating diffusion capacitor of a second tap in the plurality of taps; and
in a third period of time;
readout the first and second charges stored on the floating diffusion capacitors of the first and second taps;
reset the floating diffusion capacitors of the first and second taps; and
read the reset floating diffusion capacitors of the first and second taps.

18. The optical glass storage system of claim 17, wherein the third period of time occurs during an activation of the repositioning system.

19. The optical glass storage system of claim 17, wherein the read head further comprises:
a polarizer for filtering the light from the light source; and
an analyzer for analyzing retardance of the light from the optical glass storage system.

20. The optical glass storage system of claim 17, wherein the controller further comprises instructions executable for controlling each pixel to:
in a fourth period of time occurring before the third period of time:
accumulate a third charge on the photodetector; and
transfer the accumulated third charge to the floating diffusion capacitor of a third tap in the plurality of taps;
in a fifth period of time occurring before the third period of time;
accumulate a fourth charge on the photodetector; and
transfer the accumulated fourth charge to the floating diffusion capacitor of a fourth tap in the plurality of taps; and
in the third period of time;
readout the charges stored on the floating diffusion capacitors of the third and fourth taps.

* * * * *